United States Patent [19]

Horie et al.

[11] Patent Number: 5,083,047
[45] Date of Patent: Jan. 21, 1992

[54] PRECHARGED-TYPE LOGIC CIRCUIT HAVING DUMMY PRECHARGE LINE

[75] Inventors: Atsushi Horie, Niiza; Kimiyoshi Usami, Yokohama, both of Japan

[73] Assignee: Kabushiki Kaisha Toshiba, Kawasaki, Japan

[21] Appl. No.: 601,917

[22] Filed: Oct. 22, 1990

[30] Foreign Application Priority Data

Oct. 26, 1989 [JP] Japan .................. 1-277166

[51] Int. Cl.$^5$ ........................................ H03K 17/284
[52] U.S. Cl. .................................. 307/465; 307/469; 307/481; 365/203
[58] Field of Search ............... 307/465, 468, 469, 480, 307/481, 591, 594, 269; 365/203, 233

[56] References Cited

U.S. PATENT DOCUMENTS

| | | | |
|---|---|---|---|
| 4,611,133 | 9/1986 | Peterson et al. | 307/465 |
| 4,675,556 | 6/1987 | Bazes | 307/465 |
| 4,697,105 | 9/1987 | Moy | 307/469 X |
| 4,760,290 | 7/1988 | Martinez | 307/481 X |
| 4,769,562 | 9/1988 | Ghisio | 307/443 X |
| 4,959,646 | 9/1990 | Podkowa et al. | 307/465 X |
| 4,990,801 | 2/1991 | Caesar et al. | 307/469 |
| 5,008,569 | 4/1991 | Roy | 307/481 X |

Primary Examiner—David Hudspeth
Attorney, Agent, or Firm—Foley & Lardner

[57] ABSTRACT

Disclosed is a precharged-type logic circuit comprising dummy precharge lines connected to a load capacitance that is equivalent to the maximum or still larger as compared with load capacitances of respective precharge lines, wherein a precharge completion time of the dummy precharge lines is detected as a precharge completion time of the precharge lines, so that the precharge operation of the precharge lines is stopped under state of the dummy precharge line. Also disclosed is a precharged-type logic circuit comprising an AND plane having a first and a second dummy product term lines connected to a load capacitance that is equivalent to the maximum or still larger as compared with load capacitances of product term lines, wherein precharge operation of the product term lines is stopped by detecting a precharge completion time of the first dummy product term line as a precharge completion time of the product term lines, then read operation of the product term lines is started, further a discharge completion time of the second dummy product term line is detected as a discharge completion time of the product term lines, thereafter read of output lines is started. Moreover, disclosed is a precharged-type logic circuit comprising a dummy input line, wherein a discharge completion time of input lines is detected by a discharge completion time of the dummy input line, then precharge operation of product term lines is stopped under state of the dummy input line, so that read operation of the product term lines is started.

11 Claims, 10 Drawing Sheets

PRECHARGED-TYPE LOGIC CIRCUIT HAVING DUMMY PRECHARGE LINE

BACKGROUND OF THE INVENTION

1. Field of the Invention

The present invention relates to a precharged-type logic circuit, and particularly to a precharged-type logic circuit which can be operated at a high speed.

2. Description of the Prior Art

Figure 1:
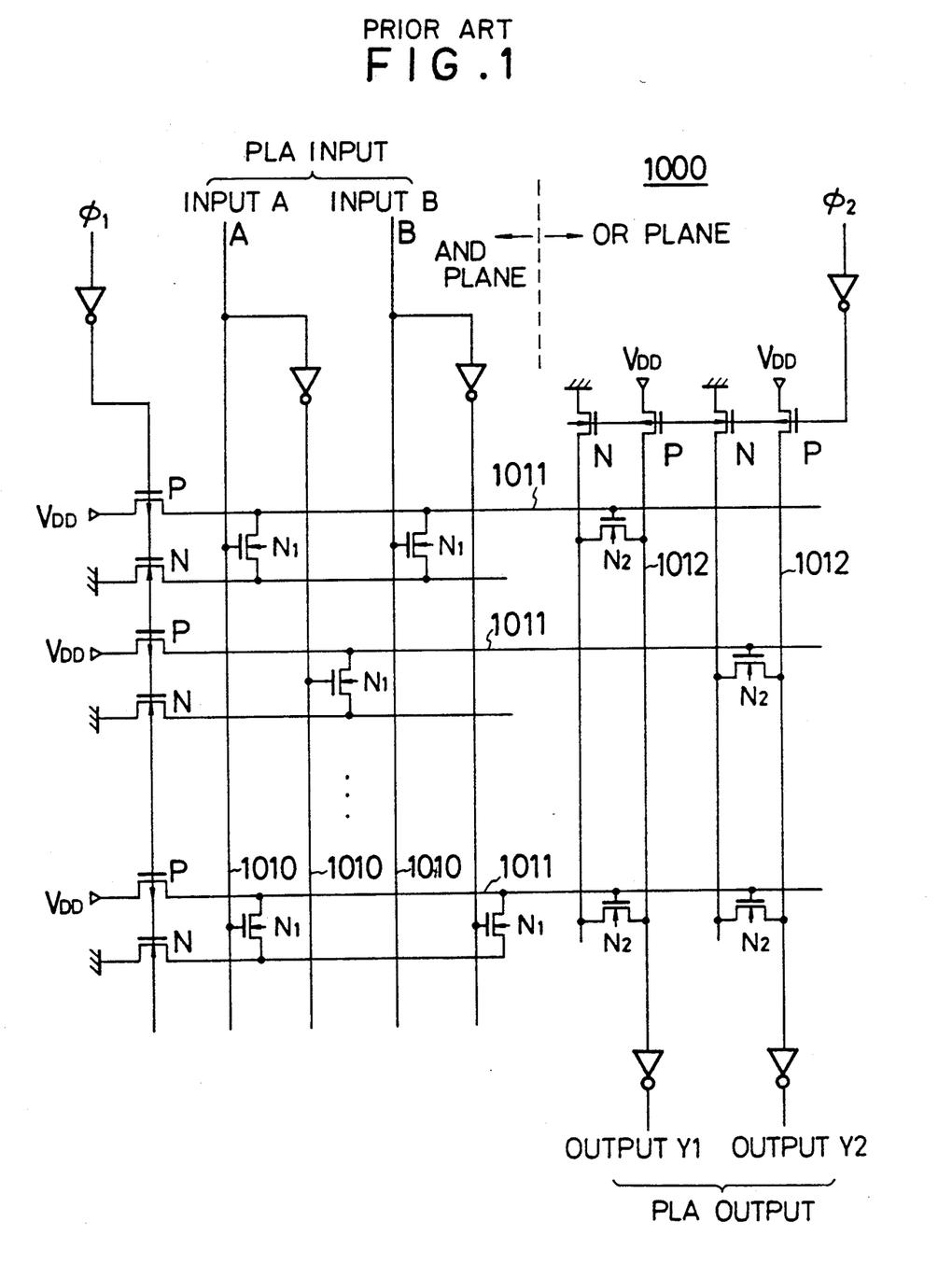
FIG. 1 is a compositional diagram of a synchronous PLA which is conventionally used.

FIG. 1 is a compositional diagram of a synchronous type PLA1000 in order to show an example of a conventional precharged-type logic circuit. In the same drawing, reference characters $\phi 1$ and $\phi 2$ show clocks to be respectively given to an AND plane as the AND array and an OR plane as the OR array, and reference numeral 1010 designates an input line for inputting a logic level, and 1011 and 1012 show a product term line and an output line, respectively, further $V_{DD}$ designates a power source.

The AND array is composed of the plurality of input lines 1010, NMOS transistors N1 and the product term lines 1011. While, the OR array comprises the output lines 1012, NMOS transistors N2 and the product term lines 1011.

Figure 2:
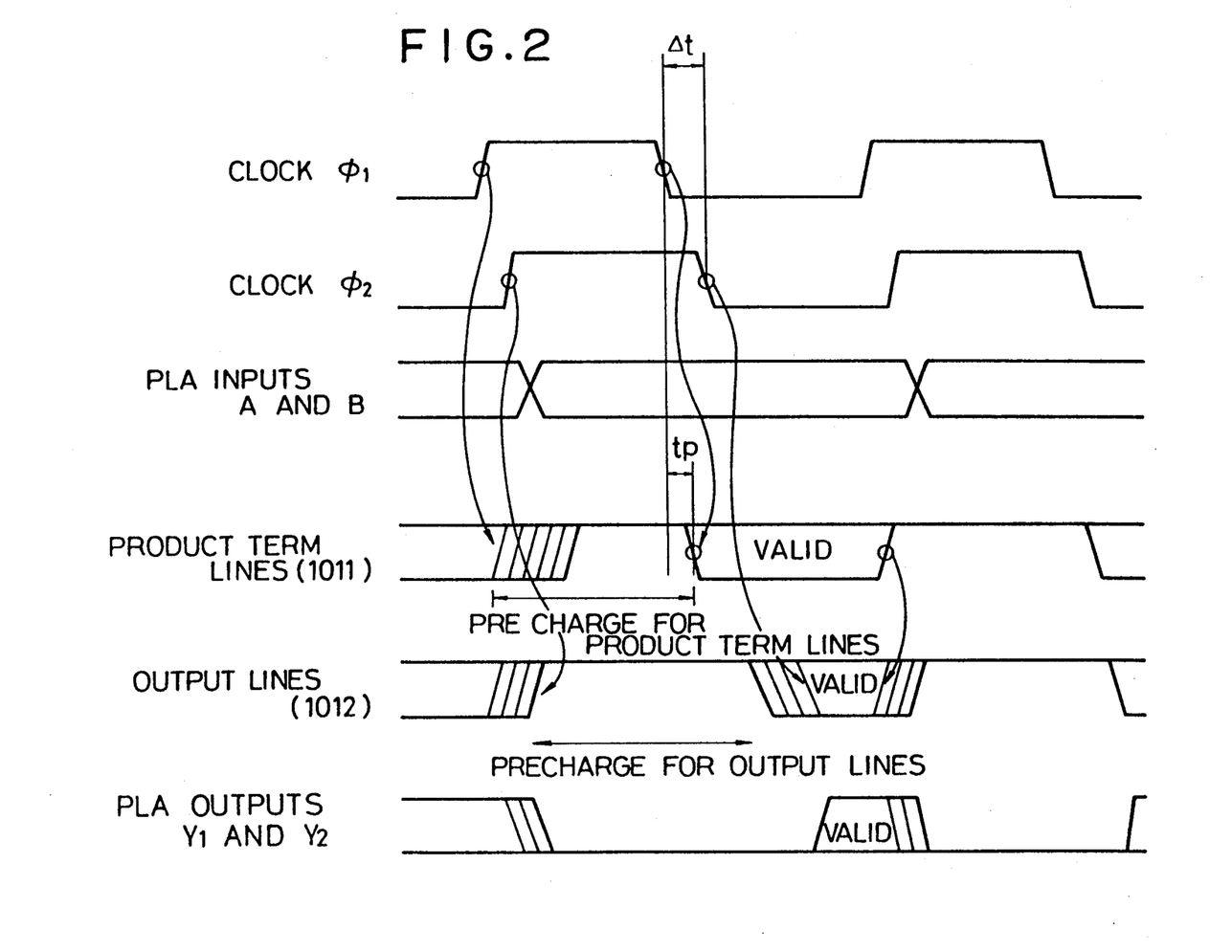
FIG. 2 is a timing chart showing operation of the conventional synchronous PLA.

FIG. 2 shows an operational timing chart of the PLA1000 having the above-mentioned composition. In the same drawing, the precharge operation of the product term lines 1011 is started at the rising time of the clock $\phi 1$ rises. After a time interval tp has passed (in which the electric potential of all the product term lines has reached a predetermined L (Low) level) from the time of the falling edge of the clock $\phi 1$, a read operation of the output lines 1012 is started at the falling edge of the clock $\phi 2$. Accordingly, when the time difference between the times of the falling edges of the clocks $\phi 1$ and $\phi 2$ is expressed by $\Delta t$, $\Delta t$ and tp is set in the relation represented by $\Delta t < tp$.

By the way, in order to improve the operation speed of the PLA1000, it is necessary to set the clock frequency of the clocks $\phi 1$ and $\phi 2$ high. However, when the frequency becomes high, operational errors are related likely to be caused in detection or determination of the time difference between the clocks $\phi 1$ and $\phi 2$. Therefore, in this case, high accuracy control of the time difference $\Delta t$ of the clocks $\phi 1$, $\phi 2$ should be required. As the result, the composition of a clock control circuit for realizing such high-accuracy time difference control must be extremely complicated.

On the other hand, since tp is the time delay caused in the PLA1000, it is very difficult to precisely control tp as well as $\Delta t$. Therefore $\Delta t$ must be set a little wider than a required value advance. Accordingly, the start time of read of the output lines 1012 is also delayed so much, that the operation efficiency of the PLA1000 is degraded.

Moreover, such difficulty in precisely controlling $\Delta t$ and tp is likely to cause timing errors in setting periods for precharge of the product term lines and the output lines, so that it is very difficult to control the timings of precharge and read operation under high-speed operational conditions.

As described above, in the PLA as the conventional precharged-type logic circuit, all of the operations are executed by control based on the rising edge and falling edge of the control clock. Accordingly, it is difficult to perform it at high speed, so that the operational efficiency of the logic circuit becomes low. In addition, the clock circuit for generating the two kinds of control clocks given the PLA is complicated.

SUMMARY OF THE INVENTION

Therefore it is an object of the present invention to provide a precharged-type logic circuit having a clock control circuit which can executed at a high speed operation and having a simple composition.

To achieve the above object, a feature of the present invention is that a precharged-type logic circuit comprises a plurality of precharge lines, and dummy precharge line connected to a load capacitance that is the maximum or still larger as compared with load capacitance of the plurality of precharge lines, wherein a completion time of a precharge operation of the dummy precharge line is detected as a time when precharge of the plurality of precharge lines is completed, so that the precharge operation to the plurality of precharge lines is stopped.

Another feature of the present invention is that a precharged-type logic circuit has a delay circuit connected to the output side of the dummy precharge line, so that the precharge completion time of the dummy precharge line controls the precharge completion time of the plurality of precharge lines in accordance with output generated from the delay circuit.

Still another feature of the present invention is that a precharged-type logic circuit comprises an AND plane comprising a plurality of product term lines, a plurality of input lines for inputting various logic levels, and first and second dummy product lines each of which is connected to a load capacitance that is the maximum or still larger as compared with load capacitances of the plurality of precharge lines, and an OR plane comprising a plurality of output lines, wherein the plurality of product lines are precharged in synchronism with a clock signal, then a completion time of a precharge operation of the first dummy product term lines is detected as a finishing time of a precharge operation of the plurality of product term lines, then the precharge operation of the plurality of product term lines is stopped under the state of the first dummy product term lines, so read of the plurality of product term lines is started, further a completion time of the discharge operation of the second dummy product term lines is detected as a completion time of the discharge operation of the plurality of product term lines, thereafter the precharge operation of the plurality of product term lines is stopped under the state of the second dummy product term lines, so that read of the plurality of output lines is started.

Still another feature of the present invention is that the precharged-type logic circuit comprises substantially the same composition as said in the previous one, wherein the AND plane further comprising a dummy input line which is connected to a load capacitance having the maximum or still larger as compared with load capacitances of the plurality of input lines, and the precharge completion time of the first dummy product term line is detected as the precharge completion time of the plurality of product term lines, further a discharge completion time of the dummy input lines is detected as a discharge completion time of the plurality of input lines, then the precharge operation of the plurality of product term lines is stopped under the state of the first dummy product term line and the dummy input line, so that read of the product term lines is started, further the precharge of the plurality of output lines is stopped under control of the second dummy product term lines, so that read of the output lines is started.

Still another feature of the present invention is that a precharged-type logic circuit comprises an AND plane comprising a plurality of product term lines, a plurality of input lines for inputting various logic levels, a dummy product term line which is connected to a load capacitance that is the maximum or still larger as compared with load capacitances of the plurality of product term lines, and dummy input line which is connected to a load capacitance that is the maximum or still larger as compared with load capacitances of the plurality of input lines, wherein a precharge completion time of the plurality of product term lines is detected by a precharge completion time of the dummy product term line, further a discharge completion time of the plurality of input lines is detected by a discharge completion time of the plurality of dummy input line, then the precharge operation of the plurality of product term lines is stopped under the state of the dummy product term line and dummy input line, so that read of the product term lines is started.

Still another feature of the present invention is that a precharged-type logic circuit comprises and AND plane including a plurality of product term lines, a plurality of input lines for inputting various logic levels, and dummy input line which is connected to a load capacitance that is the maximum or still larger as compared with load capacitances of the plurality of input lines, wherein a discharge completion time of the plurality of input lines is detected by a discharge completion time of the dummy input line, and the precharge operation of the plurality of product term lines is stopped under control of the dummy input lines, so that read of the product lines is started.

As stated above, the precharge-type logic circuits according to the present invention can carry out a read operation of the product term lines immediately after completion of the precharge operation of the product lines.

Moreover, according to the precharged-type logic circuit of the present invention, it becomes possible to execute a read operation of the OR plane immediately after completion of the discharge operation of the product lines.

Besides, it also becomes possible to carry out the read operation of the AND plane immediately after completion of the discharge operation of the input lines.

Furthermore, what is the most important effect of the present invention is that the composition of the clock control circuit becomes considerably simple as compared with the conventional one, and high speed operation thereof can be easily realized.

These and other objects, features and advantages of the present invention will be more apparent from the following description of a preferred embodiment, taken in conjunction with the accompanying drawing.

DETAILED DESCRIPTION OF THE EMBODIMENTS

Hereinafter, several embodiments according to the present invention will be explained with reference to the drawings. First of all, an embodiment in which the present invention is applied to a precharged-type PLA, an example of a precharged-type logic circuit, is described.

Figure 3:
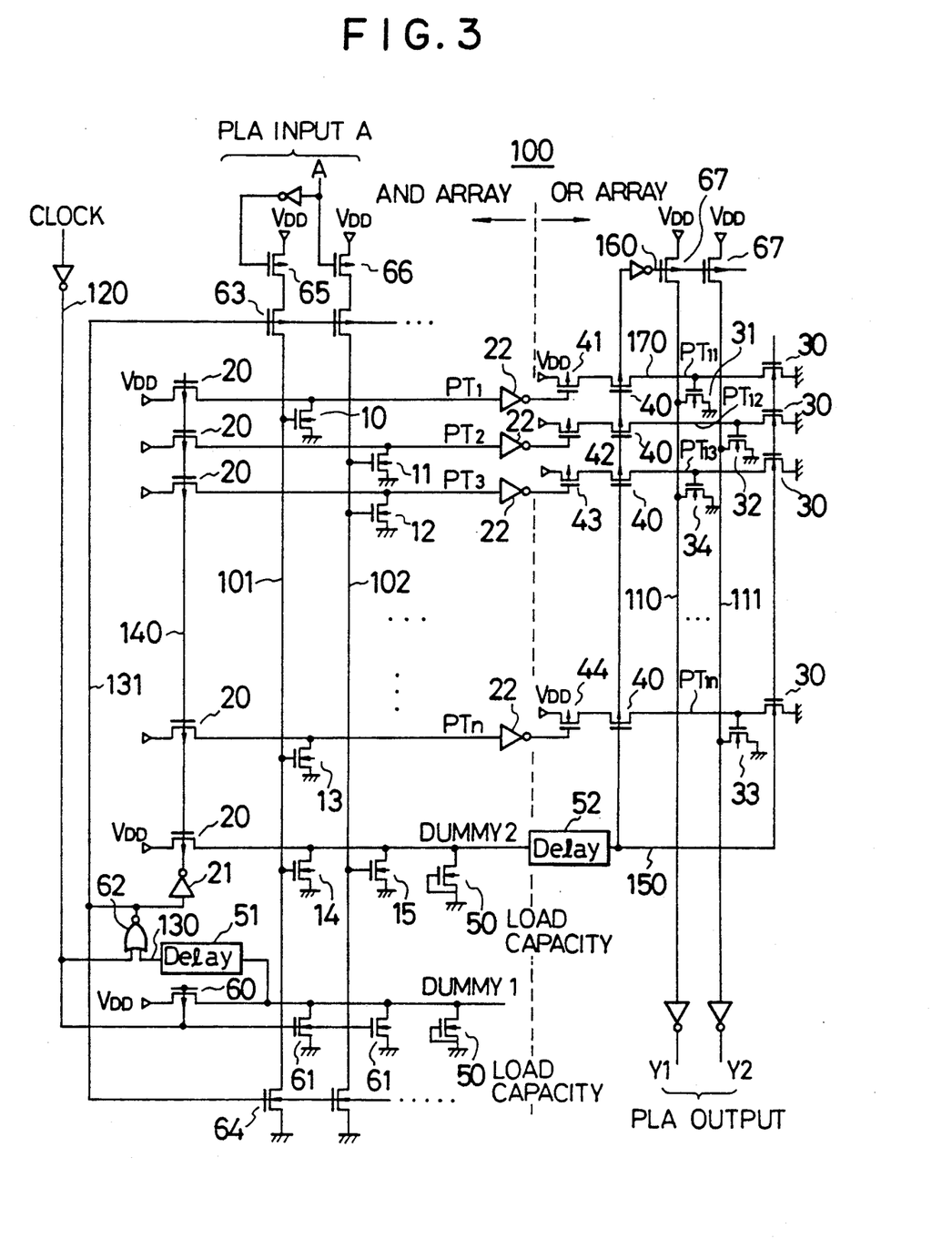
FIG. 3 is a compositional diagram of a precharged-type logic circuit according to a first embodiment of the present invention.

FIG. 3 is a compositional diagram of a PLA100 which is a first embodiment of the present invention. In the same drawing, PT1, PT2, ..., and PTn designate product term lines, and 101 and 102 show input lines. Further, 10, 11, 12, ..., 15 show N channel MOS (NMOS) transistors, and 20 designates P channel MOS (PMOS) transistors respectively used for controlling precharge operation of the product term lines. An AND plane as a AND array of the PLA100 is mainly composed of the product term lines, NMOS transistors, and PMOS transistor.

On the other hand, PT11, PT12, ..., PT1n show product term lines arranged in an OR plane as a OR array of the PLA100, and 110 and 111 respectively denote output lines. Moreover, 30, 31, 32, 33, and 34 designate NMOS transistors, and 40, 41, 42, 43, and 44 denote PMOS transistors for charging the product term lines PT11, PT12, ..., and PT1n in the OR plane, respectively. Namely, the OR plane in the PLA100 is mainly composed of the product term lines, output lines, and NMOS transistors as mentioned above.

Furthermore, 120 shows a clock control line for controlling the operation of PLA100, and $V_{DD}$ denotes a power source.

In the AND plane, dummy product term lines DUMMY1 and DUMMY2 are further provided as well as the product term lines PT1, PT2, ..., and PTn. Each of the dummy product term lines DUMMY1 and DUMMY2 is connected to a load capacitance 50 which is equivalent to the maximum load capacitance of those respectively connected to the product term lines PT1 to PTn. Accordingly, a precharge completion time of the DUMMY1 can be recognized as a precharge completion time over all the product term lines PT1 to PTn.

While, the electric potential level of the DUMMY2 is transmitted into the OR plane through a delay circuit 52.

Next, the operation of PLA100 is described with reference to FIG. 4.

Figure 4:
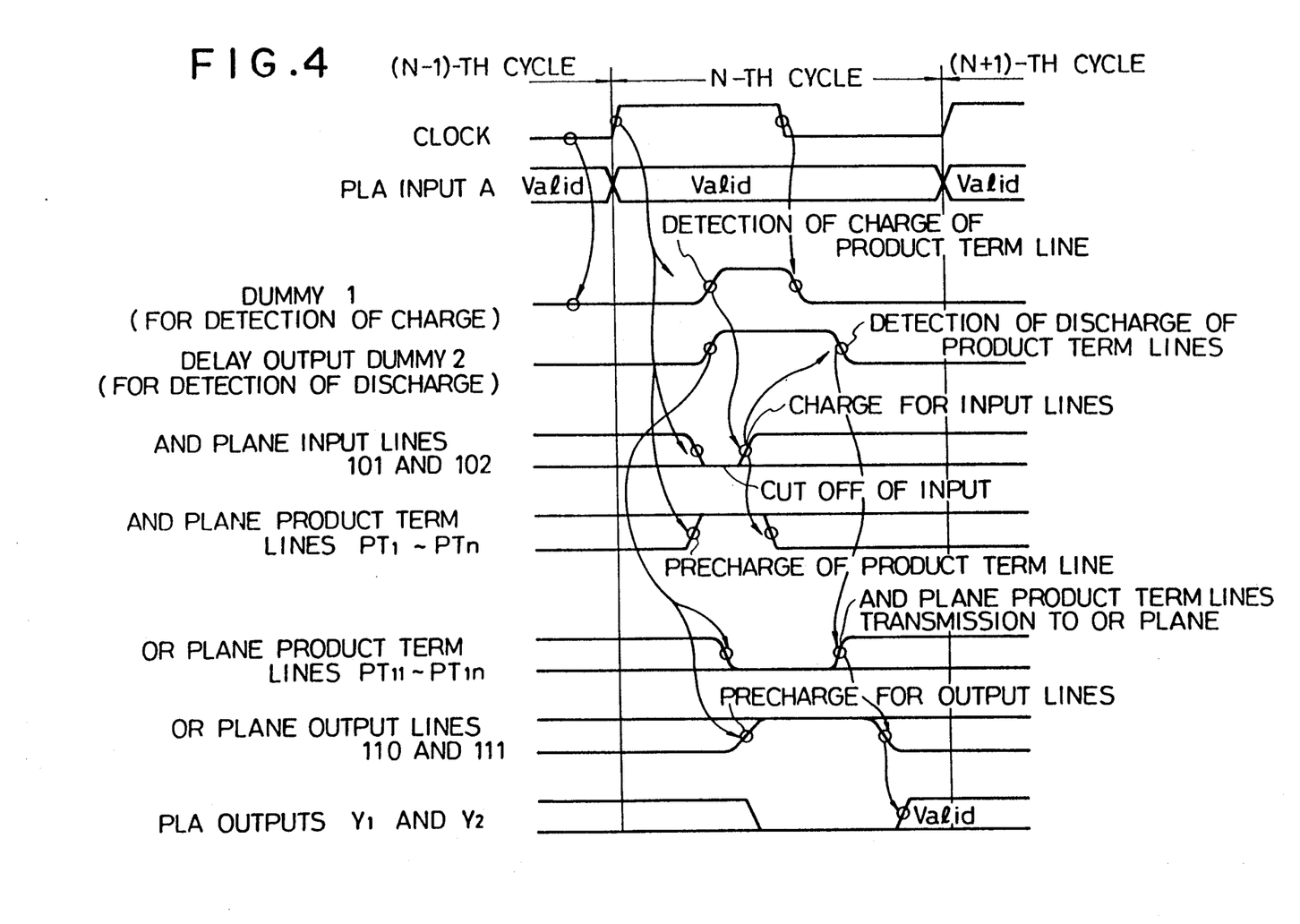
FIG. 4 is a timing chart showing operation of the precharged-type logic circuit shown in FIG. 3.

As shown in a timing chart of FIG. 4, in the (N-1)-th cycle portion just before the N-th cycle portion in which the PLA100 is operated, when a clock is in the L level, the electric potential of the clock control line 120 is in the H (High) level, so that a PMOS transistor 60 becomes OFF. While NMOS transistors becomes ON. Accordingly, the dummy product term line DUMMY1 and a node 130 are in the L level. Incidentally, a delay circuit 51 is an element not inverting logic.

Then, when the clock becomes the H level, the potential of the clock control line 120 becomes the L level. Since the node 130 has been already at the L level, the potential level of an output line 131 of a NOR gate 62 becomes the H level. Therefore, a P channel transistor 63 becomes OFF and an N channel transistor 64 becomes ON, thus all the potential levels of input lines 101 and 102 in the AND plane become the L level. Accordingly, all the N channel transistors 10 to 15 in the AND plane become the OFF. In such a state, since the output line 131 becomes the H level and a node 140 is at the L level, precharge operation of all the product term lines PT1 to PTn can be started simultaneously.

On the other hand, when the clock becomes the H level, the P channel transistor 60 becomes the ON state and the N channel transistor 61 becomes the OFF state. As the result, the precharge operation of the DUMMY1 is started similarly. Then, when the potential level of the DUMMY1 is changed into the H level, the node 130 becomes the H level through the delay circuit 51, while the output line 131 of a NOR gate 62 becomes the L level. Moreover, the node 140 becomes the H level through an inverter 21.

The respective P channel transistors 20 therefore become OFF, so that the precharge of the product term lines PT1 to PTn is stopped. At the same time, since the node 131 becomes the L level, the P channel transistor 63 becomes ON and the N channel transistor 64 becomes OFF.

As the result, the input lines 101 and 102 in the AND region are precharged in accordance with the input logic level of PLA. Accordingly, it is necessary that the input to PLA is decided prior to the completion time of precharge operation of the product term lines. For example, when input A is the H level, a P channel transistor 65 becomes ON. The input line 101 therefore is precharged, then the potential level thereof becomes the H level.

On the other hand, since a P channel transistor 66 becomes OFF, the input line 102 is not precharged, so that the potential level thereof remains at the L level. Thereafter, since the N channel transistor 10 becomes ON in accordance with the potential change of the input lines 101, 102, discharge of the product term line PT1 having been already precharged is started. While, the transistors 11 and 12 are kept in the OFF state, thus the potential levels of PT2, PT3 remain at the H level. Accordingly, unlike the conventional PLA, it is not necessary to wait the time of the falling edge of the clock for recognizing the completion time of precharge operation of the product term lines, the process having been necessary for changing the operational step to the next. Namely, in this case, the operational change from the precharge to discharge of product term lines can be successively carried out by providing the additional precharge step using the dummy product term line DUMMY1 in accordance with the input logic levels.

In such a manner, the discharge of product term lines is started in accordance with the input logic levels. then the level of the product term lines in the AND plane is correctly set at a required level when the discharge operation is completed. Thereafter, the set level are transmitted to the OR plane from the output side of the product term lines through the inverter 22, and then a read operation of the OR plane is started. At the time, a discharge completion time of the product term lines is detected by the state of the dummy product term line DUMMY2.

As described above, the dummy product term line DUMMY2 is precharged in synchronism with the precharge of the product term lines PT1 to PTn, and is discharged in synchronism with the product term line having the maximum load capacitance in the product term lines PT1 to PTn by the transistors 14 and 15 respectively connected to both of the input lines 101 and 102 to which the input A is applied.

Next, operation of the OR plane is described. The OR plane is made up of a dynamic circuit which is similarly to the AND plane, and is so constructed that the output lines thereof are precharged.

Timing of the precharge/read operation of the OR plane is controlled through the dummy product term line DUMMY2. While the product term lines are precharged, or the DUMMY2 is at the H level, the potential level of a node 150 is in the H level, and the P channel transistor is in the OFF state and the N channel transistor 30 is in the ON state.

Incidentally, the delay circuit 52 is an element not inverting logic. The product term lines PT11, PT12, . . ., and PT1n in the OR plane therefore become the L level, while all of the N channel transistors 31, 32, 33, and 34 in the OR plane become OFF. At the same time, since a node 160 is at the L level, a P channel transistor becomes ON, so that the output lines 110 and 111 are precharged.

When the AND operation at the AND plane is started, and the discharge operation of the product term lines PT1 to PTn is started, then the DUMMY2 becomes the L level, the node 150 becomes the L level through the delay circuit 52. As the result, the node 160 becomes H level. Accordingly, the P channel transistor 67 becomes OFF, then the precharge operation of the output lines is completed. Simultaneously, the P channel transistors 40 becomes ON, and the N channel transistor 30 becomes OFF. In this case, for example, when the PT1 is at the L level, the P channel transistor 41 becomes OFF, so that the product term line PT11 in the OR plane keeps at the L level. On the other hand, for example, when the PT3 is at the H level, the P channel transistor 43 and PMOS transistors 40 become ON, so that the product term line PT13 in the OR plane is precharged and the potential level thereof becomes the H level.

In such a manner, the potential levels of the product term lines PT1 to PTn in the AND plane are transmitted to the product term lines PT11 to PT1n in the OR plane, respectively. While, the N channel transistors 31, 32, 33, 34 in the OR plane become ON or OFF in accordance with the potential change of the product term lines PT11 to PT1n, thus, for example, when the product term line PT11 is at the L level and the product term line PT13 is at the H level, the N channel transistor 31 becomes OFF and the transistor 34 becomes ON. As the result, the electric charge kept in the output line 110 by the precharge operation is discharged, then the output line 110 becomes the L level. Thereafter, the levels of output lines 110 and 111 are respectively read as outputs Y1 and Y2 of the PLA100 through suitable inverters.

As stated above, the completion time of the discharge operation of the product term lines can be detected by the discharge completion time of the dummy product term line DUMMY2. Accordingly, the precharge and discharge operations can be carried out smoothly and rapidly as compared with the case of the conventional method in which the discharge completion time of product term lines is decided on the basis of the time of the falling edge of the clock.

The explanation as described above means a basic operation of the PLA 100 according to the present invention.

Next, the delay circuits 51 and 52 are explained in more detail.

Both of the delay circuits 51 and 52 are provided in the system to prevent faulty operations about timing. For example, when a completion time of the precharge operation of product term lines PT1 to PTn is detected by the state of the dummy product term line DUMMY1, a suitable delay time is added to the completion time by the delay circuit 51, thereafter the precharge of product term lines PT1 to PTn is stopped. To the contrary, when the dummy product term line DUMMY1 is directly connected to the NOR gate 62 not through the delay circuit 51, occasionally by the threshold values of the NOR gate 62 and inverter 21, the inverter 21 is inverted through the gate 62. In such case, the P channel transistor 20 becomes OFF before the electric potential of the DUMMY1 becomes the H level completely. As the result, the precharge of product term lines PT1 to PTn is occasionally stopped before the product term lines are not precharged sufficiently.

The reason why the delay circuit 52 is provided is almost similar to that as to the delay circuit 51.

Figure 5:
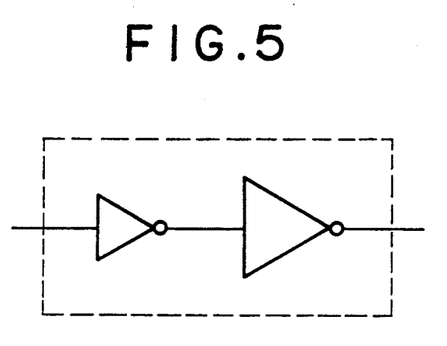
FIG. 5 is a compositional diagram of a delay circuit.
Figure 6:
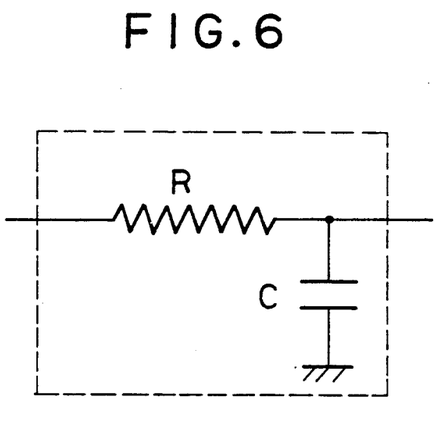
FIG. 6 is another compositional diagram of a delay circuit.

FIGS. 5 and 6 show examples of the delay circuits 51 and 52. Namely, FIG. 5 shows an example which is composed of inverters connected by the cascade connection, while FIG. 6 shows another example of the delay circuit which is composed of a resistance and a load capacitor.

Though the dummy product term lines are provided in the first embodiment to control the precharge operation in both of the AND and OR planes, it is also possible to provide the dummy product line only used for controlling the precharge operation of the AND plane.

Hereinafter, a second and a third embodiment in both of which one dummy bit line is provided in a memory circuit in place of the dummy product term lines will be explained.

Figure 7:
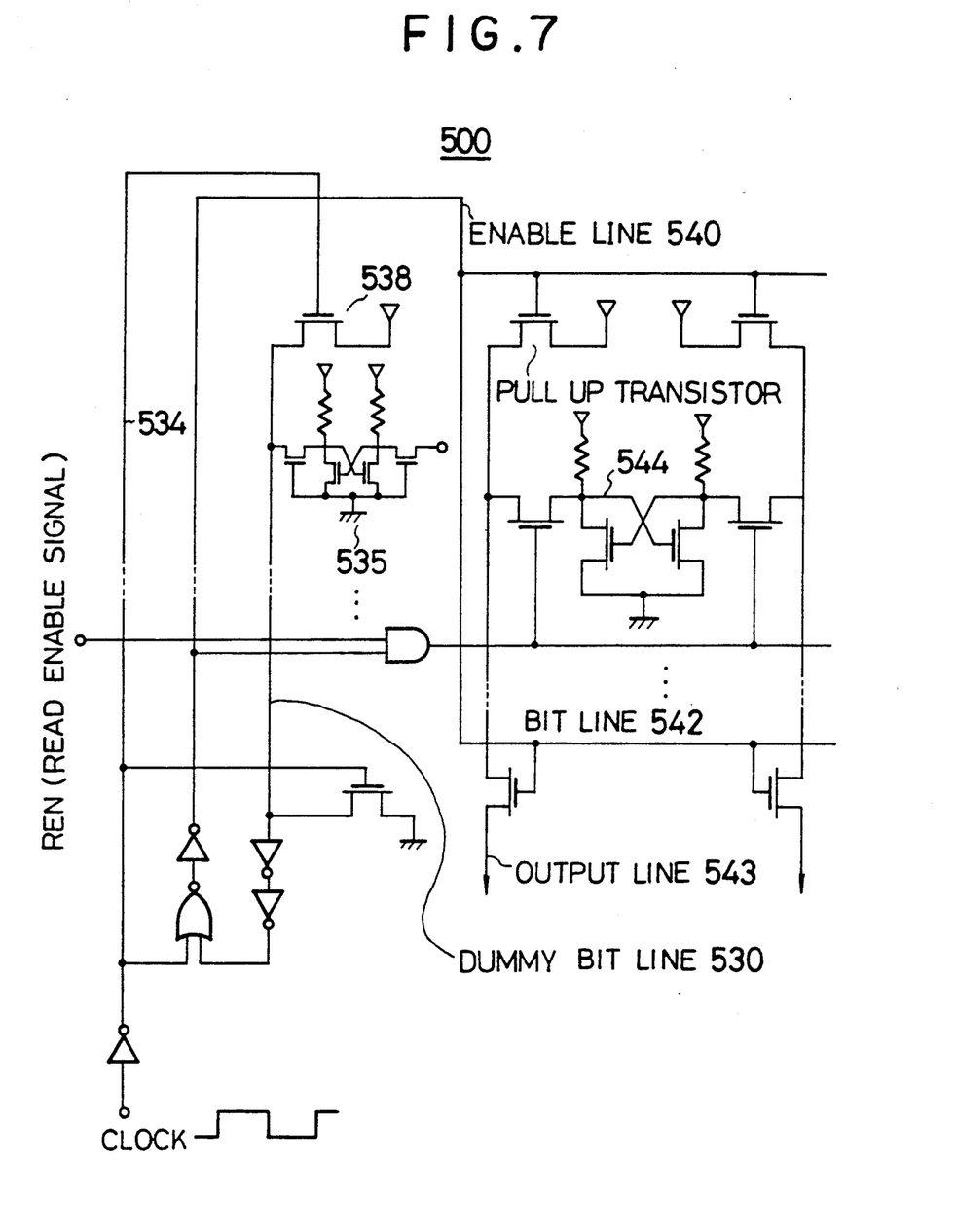
FIG. 7 is a compositional diagram of a precharged-type SRAM which is a second embodiment of the present invention.

FIG. 7 is a compositional diagram showing only read operation of a precharge type SRAM (Static Random Access Memory) which is the second embodiment of the present invention.

In the same drawing, reference numeral 530 shows a dummy bit line having a load capacitor 535 equivalent to the maximum load capacitance of the bit lines provided in the SRAM500. Incidentally, the dummy bit line 530 plays the same role as the dummy product term line DUMMY1 in the first embodiment.

Moreover, the composition includes an enable line 540 for controlling precharge, pull-up transistors 538 and 541, bit lines 542, an output line 543 and a memory cell 544.

Next, operation of the SRAM500 is described.

The potential level of the enable line 540 becomes the L level at the time of the rising edge of a clock to be inputted. Then, the pull-up transistor 541 becomes ON, so that the bit lines 542 are precharged. When the precharge operation of the bit lines 542 are completed, the input line 540 immediately becomes the H level, then the precharge is finished.

In the prior art, it is difficult to input a read enable signal (REN) before the completion time of the precharge operation of the bit line is completely detected by the falling edge of the clock. However, in the SRAM 500 of the present embodiment, the read enable signal (REN) can be applied to the SRAM 500 immediately after the potential level of the input line 540 becomes the H level.

Accordingly, due to the dummy bit line, the read of logoc in the RAM cell can be executed without waiting the time of the falling edge of the clock.

Figure 8:
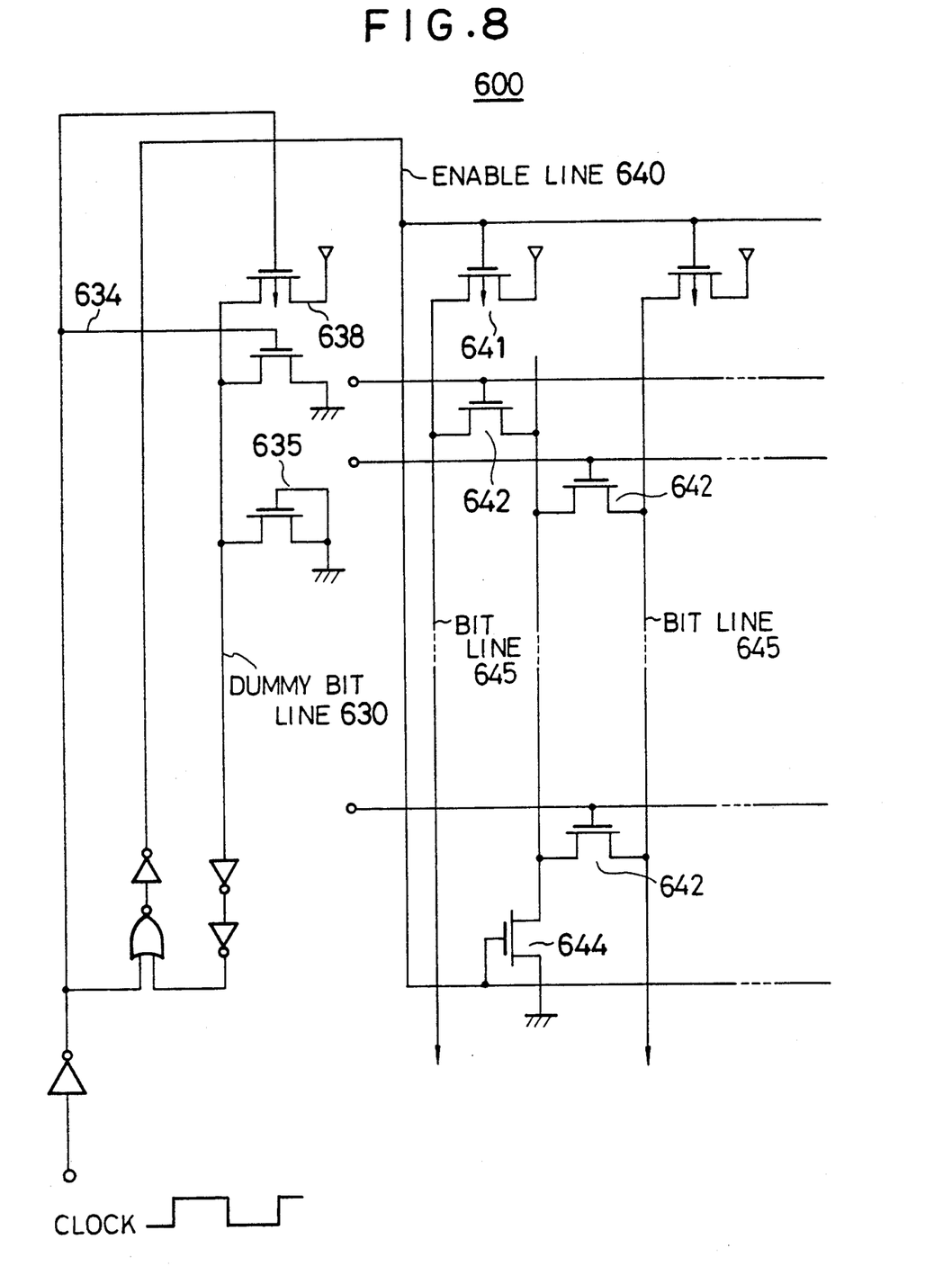
FIG. 8 is a compositional diagram of a precharged-type ROM which is a third embodiment of the present invention.

FIG. 8 shows a compositional diagram of a precharge ROM600 which is the third embodiment of the present invention.

As shown in the same drawing, the precharge ROM600 comprises a dummy bit line 630, an enable line 640 for controlling precharge operation, a pull-up transistor 641, memory elements 642, a pull-down transistor 644 and bit lines 645. Moreover, the dummy bit line 630 is connected to a load capacitance 635 which is equivalent to the maximum capacitance of the bit lines 645 provided in the ROM 600.

Next, operation of the ROM600 will be explained when a rising edge of a clock to be applied to the ROM600 occurs, the potential level of the enable line 640 becomes the L level, then the pull-up transistor 641 becomes ON, so that bit lines 645 are precharged. The completion time of precharge operation of all the bit lines 645 is represented by the precharge completion time of the dummy bit line 630. Therefore, the operation including the precharge can be successively carried out by judging the precharge of all the bit lines on the basis of the precharge completion time of the dummy bit line 630.

However, in the prior art, the precharge completion time has been judged by the time of the falling edge of the clock, so that time waiting to some extent must be required. After the precharge operation, when the enable line 640 becomes the H level, the pull-up transistor 641 becomes OFF and the pull-down transistor 644 becomes ON, so that the memory level stored in the memory element 642 is read out through the node 645. Accordingly, the read operation of the ROM600 can be rapidly executed.

Figure 9:
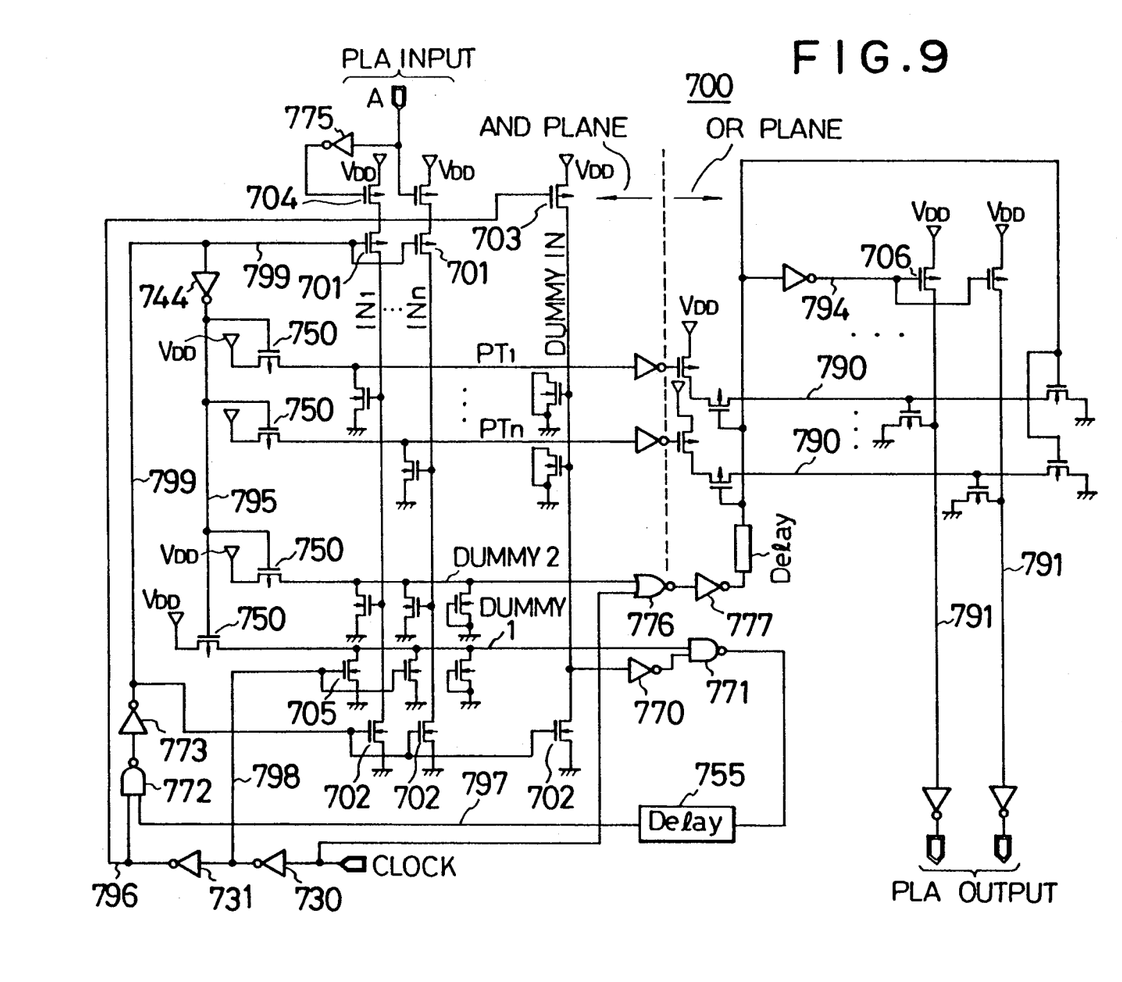
FIG. 9 is a compositional diagram of a precharge-type PLA which is a fourth embodiment of the present invention.
Figure 10:
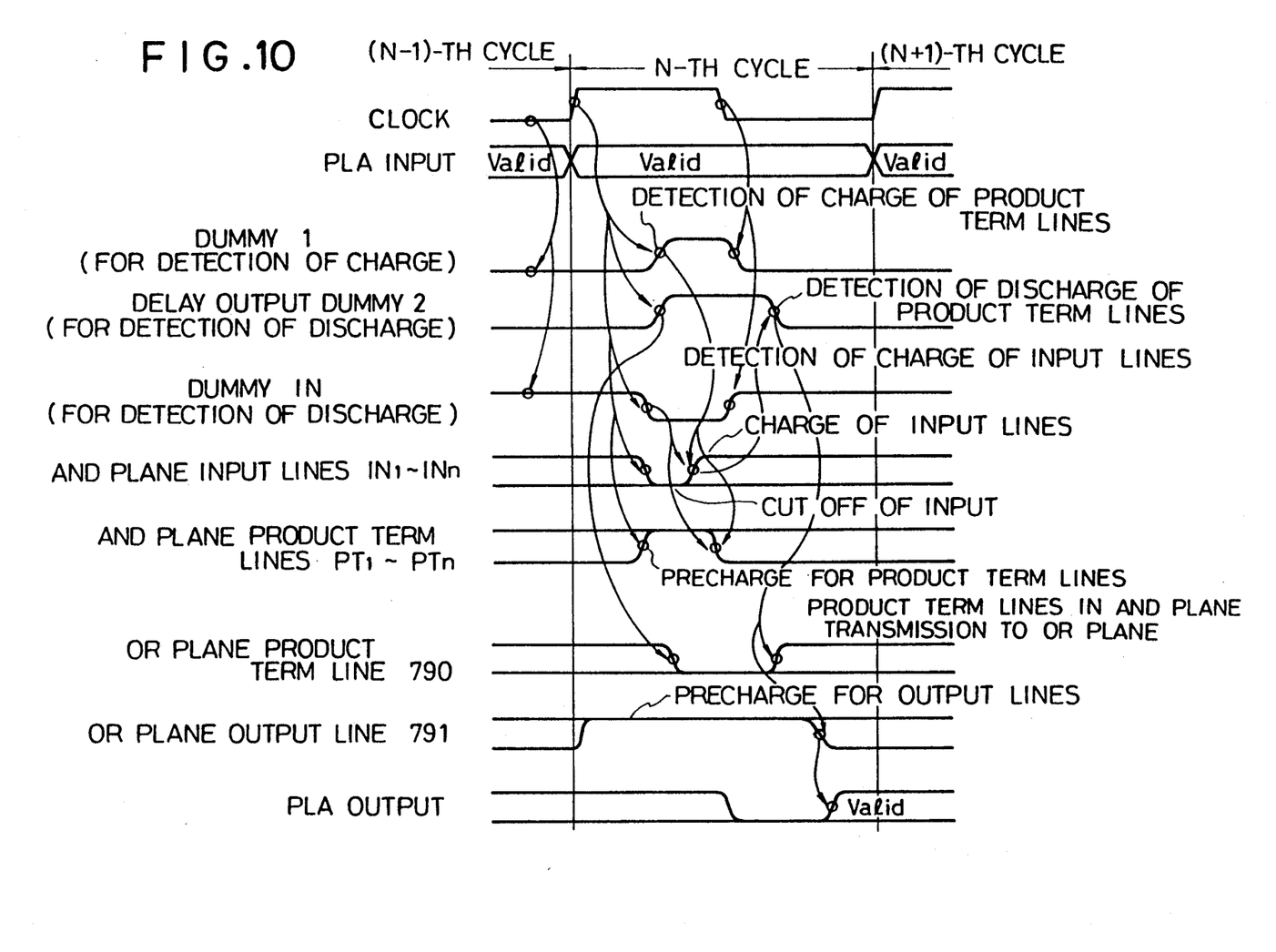
FIG. 10 is a timing chart showing operation of a precharged-type PLA, the fourth embodiment.

FIG. 9 is a compositional diagram of a PLA700 which is a fourth embodiment of the present invention. While, FIG. 10 shows a timing chart to explain operation of the PLA700. The composition of PLA700, except the following portion, is almost the same as that described in the first embodiment.

In the first embodiment, the dummy product term lines DUMMY1 and DUMMY2 for detecting the completion time of the precharge operation and discharge operation are used, while in the fourth embodiment, a dummy input line DUMMYIN is further provided for detecting the completion time of discharge operation of input lines IN1, . . . , and INn as well as these dummy product term lines. As the result, the time of the precharge operation of the product term lines is controlled by both of the DUMMY1, DUMMY2 and DUMMYIN. Incidentally, the dummy input line DUMMYIN is connected to a load capacitance which is equivalent to the maximum load capacitance of the input lines IN1 to INn.

On the other hand, the precharge operation of the product term lines 790 and the output lines 791 provided in the OR plane is controlled in accordance with the logic sum between the output of the DUMMY2 for detcting the discharge completion time of the product term lines and a clock signal.

Next, operation of the PLA700, especially operation of the dummy input line DUMMYIN, will now be explained with reference to the timing chart as shown in FIG. 10.

When a clock to be given to the PLA700 becomes the L level in the (N-1)-th cycle, the DUMMY1 becomes the L level. At the same time, the DUMMYIN also becomes the H level. As the result, a node 797 becomes the H level in accordance with a logic operation composed of a NAND gate 771 and an inverter 770 to both of which the levels of the DUMMY1 and DUMMYIN are inputted.

Then, the operational mode is shifted in the N-th cycle, so that the clock changes into the H level. Accordingly, a node 796 becomes the H level. While, since the node 797 has been already at the H level, an output line 799 of an inverter 773 becomes the H level in accordance with a logic operation composed of a NAND gate 772 and the inverter 773. When the node 799 becomes the H level, an output line 795 of an inverter 744 becomes the L level, so that all of P channel transistors 750 for precharging the product term lines PT1 to PTn including the product term lines become ON, then precharge operation of the product term lines PT1 to PTn is started. At the same time, P channel transistors 701 become OFF (and the node 799 is the H level), so that N channel transistors 702 become ON. While, when the P channel transistors 701 become OFF, the input to the AND plane is cut off, then the discharge operation of the input lines represented by the input line IN1 is started by the N channel transistors 702 which respectively remain in the ON state.

On the other hand, a P channel transistor 703 becomes OFF at the same time of the dummy input line DUMMYIN (in this case, the node 796 is at the H level). However, since the node 799 remains at the H level, the N channel transistors 702 also remains ON. Namely, the DUMMYIN is also discharged as well as the other input lines. In this case, the completion time of the discharge operation of the input lines IN1 to INn is represented by a timing of discharge completion of the DUMMYIN.

Then, output of the NAND gate is inverted in accordance with the later timing of both of the precharge completion timing of the DUMMY1 and the discharge completion timing of the DUMMYIN. As the result, the node 797 is inverted into the L level (in the initial state, it is in the H level). In this case, it is possible to give the output of the NAND 771 to the node 797 directly or through a delay circuit 755 not inverting logic.

As the result, the output line 799 of the inverter 773 is inverted into the L level. Then, a transistor 750 for precharging the product term lines so as to invert the node 795 into the H level through the inverter 744 becomes OFF, then the precharge operation of the product term lines is completed. At the timing, since the node 799 remains at the L level, the P channel transistors 701 becomes ON and the N channel transistors 702 becomes OFF.

For example, when the input A is at the H level, the output of an inverter 775 becomes the L level, and a P channel transistor 704 becomes ON as well as the P channel transistor 701, so that the input line N1 becomes the H level. In such a manner, the readout operation of the AND plane is started by inputting logic.

While, in the latter half of the N-th cycle, since the clock becomes the L level, the node 796 becomes the L level. Moreover, the node 799 also becomes the L level in accordance with a logic operation composed of the inverter 773 and the NAND gate 772, further the nodes 795 and 798 become the H level. As the result, the transistor 705 becomes ON, and the transistor 750 becomes OFF, further 703 becomes ON and 702 becomes OFF. Then, the DUMMY1 is discharged to be at the L level, while the DUMMYIN is precharged to be at the H level, so that the operation mode is initialized to the same state as in the (N-1)-th cycle.

Next, operation of a logic sum circuit 776 provided on the output side of the second dummy product term line DUMMY2 is explained.

As one example of the operation of the DUMMY2, precharge control operation of the output lines 791 in the OR plane can be mentioned. When the DUMMY2 is at the H level, a node 794 becomes the L level, so that P channel transistors 706 become ON. As the result, precharge operation of the output lines 791 is started. Conversely, when the DUMMY2 is at the L level (and the clock is also at the L level), the node 794 becomes the H level, then the transistors 706 becomes OFF. As the result, the precharge operation of the output line 791 is stopped. Accordingly, the precharge operation of the output line 791 must be completed in the interval in which the potential level of the DUMMY2 is changed from the H level to L level. Namely, the period in which the DUMMY 2 is at the H level becomes more longer, it can be executed exactly to the precharge operation time of the output lines 791.

The DUMMY2 becomes the H level when the clock becomes the H level and then the level of the node 795 changes to the L level and the precharge operation is started by the P channel transistor 750.

On the other hand, the DUMMY2 becomes the L level when the input logic is applied to the AND plane and the state of the input lines IN1 to INn are changed in accordance with it, so that the levels of the product term lines PT1 to PTn having been precharged at the H level are changed. As shown in FIG. 9, the delay operation comprising five steps is carried out by the logic gates 730, 731, 772, 773, 774 in the time period from when the clock becomes the H level until the DUMMY2 catches the clock.

In this case, the precharge operation of the output lines 791 is controlled by the logic sum composed of the DUMMY2 and the clock through the logic sum circuit 776. Accordingly, as compared with the PLA100 of the first embodiment in which the precharge operation of the output lines is controlled only by the DUMMY2, the precharge operation can be started earlier and held longer.

Figure 11:
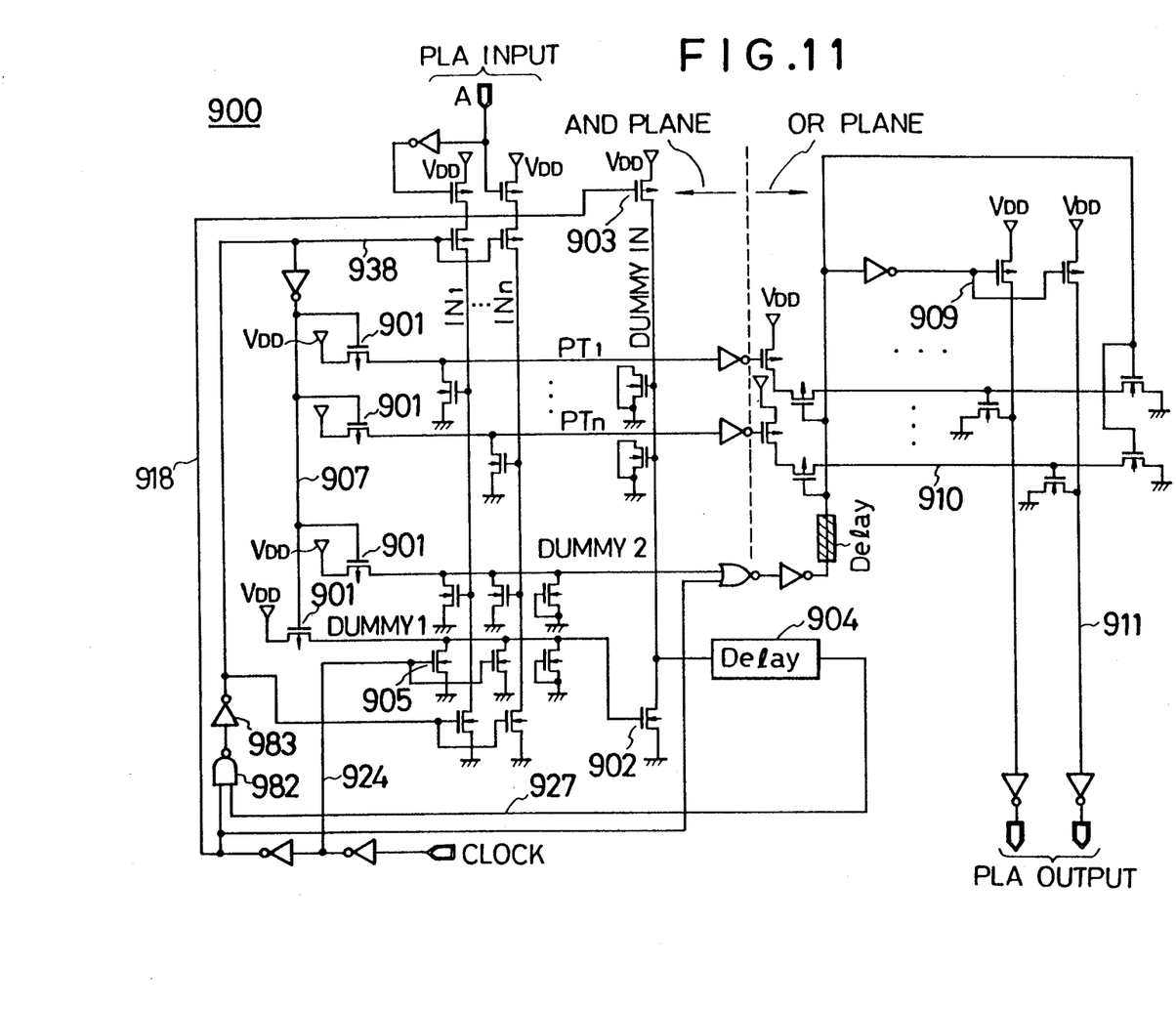
FIG. 11 is a compositional diagram showing a precharged-type PLA according to a fifth embodiment of the present invention.

FIG. 11 is a compositional diagram of a PLA900 which is a fifth embodiment of the present invention. This embodiment is the same as the fourth embodiment in that a dummy product term lines DUMMY1, DUMMY2 and a dummy input line DUMMYIN are provided therein. On the other hand, in the present embodiment, the connection of the DUMMY1 and DUMMYIN are different from those in the fourth embodiment.

In the fourth embodiment previously described, the circuit composition is so formed that the control of the precharge operation of the product term lines is carried out in accordance with a signal applied later of those from the DUMMY1 and the DUMMYIN. On the other hand, in this embodiment, the output side of DUMMY1 is connected to an N channel transistor 902, so that the precharge operation is controlled directly by output of the DUMMYIN.

In this case, a delay circuit 904 not inverting logic is occasionally connected to the DUMMYIN.

Hereinafter, operation for controlling precharge of the product term lines in the PLA900 will be explained.

When a clock to be inputted to the system is at the L level in the (N-1)-th cycle of operation, a node 918 becomes the L level, and a node 938 also becomes the L level in accordance with a logic operation composed of a NAND gate 982 and an inverter 983. While, the potential levels of nodes 907 and 924 become the H level together. As the result, P channel transistors 901 become OFF, and a P channel transistor 903 and N channel transistors 905 become ON together. Then, the DUMMY1 is discharged by the N channel transistors 905 to be at the L level.

Accordingly, an N channel transistor 902 becomes OFF, so that the DUMMYIN is precharged by the P channel transistor 903 to be at the H level. Then, a node 927 becomes the H level. As the result, the N-th cycle of operation is started.

When the clock becomes the H level in the N-th cycle, the potential level of the node 924 is changed into the L level and the node 918 becomes the H level. Moreover, since the node 927 has been already at the H level, the node 938 becomes the H level in accordance with a logic composed of the NAND gate 982 and inverter 983. Then, the node 907 becomes the L level. As the result, the P channel transistors 901 become ON, 903 becomes OFF and the N channel transistors 905 become OFF. In this case, the DUMMY1 is precharged by the P channel transistors 901 to be at the H level. Then, the N channel transistor 902 becomes ON, so that electric charge applied to the DUMMYIN by the precharge operation in the (N-1)-th cycle is discharged by the N channel transistor 902. As the result, the potential level of the DUMMYIN is changed into the L level. Consequently, the node 927 is inverted into the L level, so that the node 938 is changed into the L level in accordance with a logic of the NAND gate 982 and the inverter 983. As the result, the node 907 becomes the H level, thus the P channel transistors 901 become OFF, then the precharge operation is finished.

Since the operation of the fifth embodiment is completely the same as the respectively corresponding portions described in the first and the fourth embodiment, the explanation is omitted.

Various modification will become possible for those skilled in the art after receiving the teachings of the present disclosure without departing from the scope thereof.

What is claimed is:

1. A precharged-type logic circuit, comprising:
a plurality of precharge lines; and
a dummy precharge line connected to a load capacitance that is the maximum or still larger as compared with load capacitances of the plurality of precharge lines, wherein a completion time of a precharge operation of the dummy precharge line is detected as a completion time of a precharge operation of the plurality of precharge lines, so that the precharge operation to the plurality of precharge lines is stopped by the state of the dummy precharge lines.

2. A precharged-type logic circuit according to claim 1, wherein the precharged-type logic circuit further comprises a delay circuit connected to the output side of the dummy precharge lines, so that the precharge completion time of the dummy precharge lines controls the precharge completion time of the plurality of precharge lines in accordance with output of the delay circuit.

3. A precharged-type logic circuit according to claim 1, wherein the plurality of precharge lines are product term lines, and the dummy precharge lines are dummy product term lines.

4. A precharged-type logic circuit according to claim 2, wherein the plurality of precharge lines are product term lines, and the dummy precharge lines are dummy product term lines.

5. A precharge type memory circuit according to claim 1, wherein the plurality of precharge lines are bit lines, and the dummy precharge lines are dummy bit lines.

6. A precharged-type programmable logic array operated under a clock signal, comprising:
an AND plane comprising:
a plurality of product term lines;
a plurality of input lines for inputting logic levels; and
first and second dummy product term lines each of which is connected to a load capacitance that is the maximum or still larger as compared with load capacitances of the plurality of precharge lines; and
an OR plane comprising a plurality of output lines; wherein
the plurality of product term lines are precharged in synchronism with the clock signal, and a completion time of precharge operation of the first dummy product term lines is detected as a completion time of precharge operation of the plurality of product term lines; then
the precharge operation of the plurality of product term lines is stopped under the state of the first dummy product term lines, so that read operation of the plurality of product term lines is started; and
a complete time of discharge operation of the second dummy product term lines is detected as a completion time of discharge operation of the plurality of product term lines, thereafter precharge operation of the plurality of output lines is stopped under state of the second dummy product term lines, so that read operation of the plurality of output lines is started.

7. A precharged-type programmable logic array according to claim 6, wherein
the AND plane further comprising a dummy input line connected to a load capacitance that is the maximum or still larger as compared with load capacitances of the plurality of input lines, and
the precharge completion time of the first dummy product term lines is detected as the precharge completion time of the plurality of product term lines, further
a discharge completion time of the dummy input line is detected as a discharge completion time of the plurality of input lines, then
the precharge operation of the plurality of product term lines is stopped under states of the first dummy product term lines and the dummy input line, so that the read operation of the product term lines is started, further the precharge operation of the plurality of output lines is stopped under state of the second dummy product term lines, so that the read operation of the output lines is started.

8. A precharged-type programmable logic array according to claim 6, wherein the precharge operation of the plurality of output lines is controlled in accordance with a logic sum of output of the second dummy product term lines and the clock signal.

9. A precharged-type programmable logic array according to claim 7, wherein the precharge operation of the plurality of output lines is controlled in accordance with a logic sum of output of the second dummy product term line and the clock signal.

10. A precharged-type programmable logic array, comprising:

an AND plane comprising:
a plurality of product term lines;
a plurality of input lines for inputting logic levels; and
a dummy product term line connected to a load capacitance that is the maximum or still larger as compared with load capacitances of the plurality of product term lines; and
a dummy input line connected to a load capacitance that is the maximum or still larger as compared with load capacitances of the plurality of input lines;

wherein
a precharge completion time of the plurality of product term lines is detected by a precharge completion time of the dummy product term line; further
a discharge completion time of the plurality of input lines is detected by a discharge completion time of the dummy input lines; then
the precharge operation of the plurality of product term lines is stopped under state of the dummy product term line and dummy input line, so that read operation of the product term lines is started.

11. A precharged-type programmable logic array, comprising:

an AND plane comprising:
a plurality of product term lines;
a plurality of input lines for inputting logic levels; and
a dummy input line connected to a load capacitance that is the maximum or still larger as compared with load capacitances of the plurality of input lines;

wherein a discharge completion time of the plurality of input lines is detected by a discharge completion time of the dummy input lines, and the precharge operation of the plurality of product term lines is stopped under state of the dummy input lines, so that read operation of the product term lines is started.

* * * * *